United States Patent
Shen et al.

(10) Patent No.: US 9,099,519 B2
(45) Date of Patent: Aug. 4, 2015

(54) SEMICONDUCTOR DEVICE AND METHOD OF FORMING JUNCTION ENHANCED TRENCH POWER MOSFET

(75) Inventors: Zheng John Shen, Oviedo, FL (US);
Patrick M. Shea, Oviedo, FL (US);
David N. Okada, Chandler, AZ (US)

(73) Assignee: Great Wall Semiconductor Corporation, Tempe, AZ (US)

( * ) Notice: Subject to any disclaimer, the term of this patent is extended or adjusted under 35 U.S.C. 154(b) by 226 days.

(21) Appl. No.: 13/479,142

(22) Filed: May 23, 2012

(65) Prior Publication Data

US 2013/0313640 A1    Nov. 28, 2013

(51) Int. Cl.
| | |
|---|---|
| *H01L 29/739* | (2006.01) |
| *H01L 29/78* | (2006.01) |
| *H01L 29/66* | (2006.01) |
| *H01L 29/417* | (2006.01) |
| *H01L 29/40* | (2006.01) |
| *H01L 29/06* | (2006.01) |
| *H01L 29/10* | (2006.01) |
| *H01L 29/08* | (2006.01) |

(52) U.S. Cl.
CPC ........ *H01L 29/7395* (2013.01); *H01L 29/4175* (2013.01); *H01L 29/66659* (2013.01); *H01L 29/66666* (2013.01); *H01L 29/66712* (2013.01); *H01L 29/66727* (2013.01); *H01L 29/7393* (2013.01); *H01L 29/7802* (2013.01); *H01L 29/7827* (2013.01); *H01L 29/7835* (2013.01); *H01L 29/0634* (2013.01); *H01L 29/0653* (2013.01); *H01L 29/0878* (2013.01); *H01L 29/1045* (2013.01); *H01L 29/1095* (2013.01); *H01L 29/407* (2013.01); *H01L 29/41766* (2013.01)

(58) Field of Classification Search
CPC ............ H01L 29/7827; H01L 29/0696; H01L 29/66545; H01L 29/7802; H01L 29/66666; H01L 29/1083; H01L 29/402; H01L 29/423; H01L 29/6653; H01L 29/66712; H01L 29/7395; H01L 29/7811; H01L 29/6656
USPC ............ 257/328, 329, 335, 336, 341, E29.13, 257/E29.131, E29.132, E29.133, E29.027, 257/E29.066, E29.197, E29.198
See application file for complete search history.

(56) References Cited

U.S. PATENT DOCUMENTS

| | | | | |
|---|---|---|---|---|
| 6,376,878 | B1 * | 4/2002 | Kocon | 257/328 |
| 6,608,350 | B2 * | 8/2003 | Kinzer et al. | 257/341 |
| 6,624,472 | B2 * | 9/2003 | Hurkx et al. | 257/339 |
| 6,800,897 | B2 * | 10/2004 | Baliga | 257/328 |
| 8,378,416 | B2 * | 2/2013 | Darwish et al. | 257/329 |
| 2007/0052058 | A1 * | 3/2007 | Hirler et al. | 257/492 |
| 2013/0168762 | A1 * | 7/2013 | Darwish | 257/330 |

* cited by examiner

*Primary Examiner* — Eduardo A Rodela
(74) *Attorney, Agent, or Firm* — Robert D. Atkins; Patent Law Group: Atkins and Associates, P.C.

(57) ABSTRACT

A semiconductor device has a substrate and first and second gate structures formed over a first surface of the substrate. A drain region is formed in the substrate as a second surface of the substrate. An epitaxial region is formed in the substrate over the drain region. A sidewall spacer is formed over the first and second gate structures. A lateral LDD region is formed between the first and second gate structures. A trench is formed through the lateral LDD region and partially through the substrate self-aligned to the sidewall spacer. A vertical drift region is formed along a sidewall of the trench. An insulating material is deposited in the trench. A first source region is formed adjacent to the first gate structure opposite the lateral LDD region. A second source region is formed adjacent to the second gate structure opposite the lateral LDD region.

21 Claims, 9 Drawing Sheets

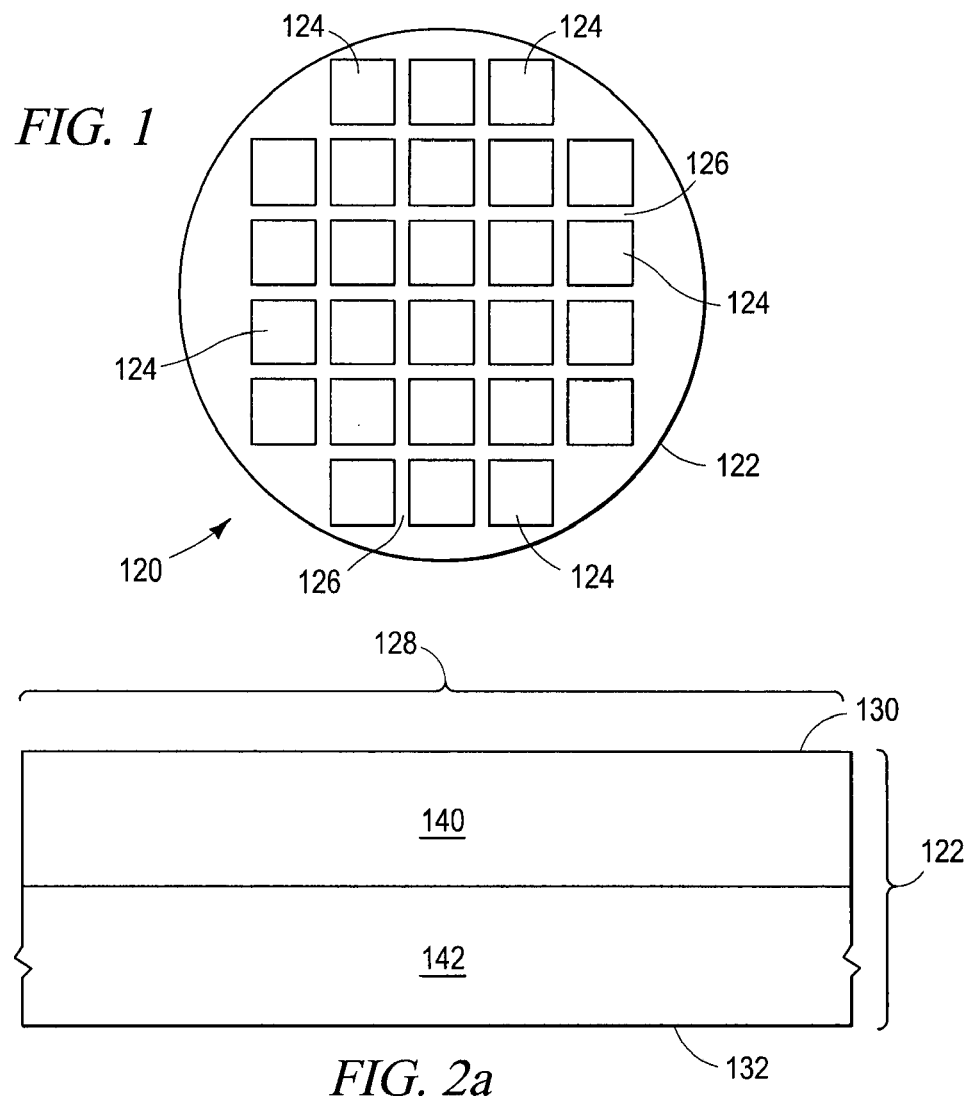
*FIG. 1*
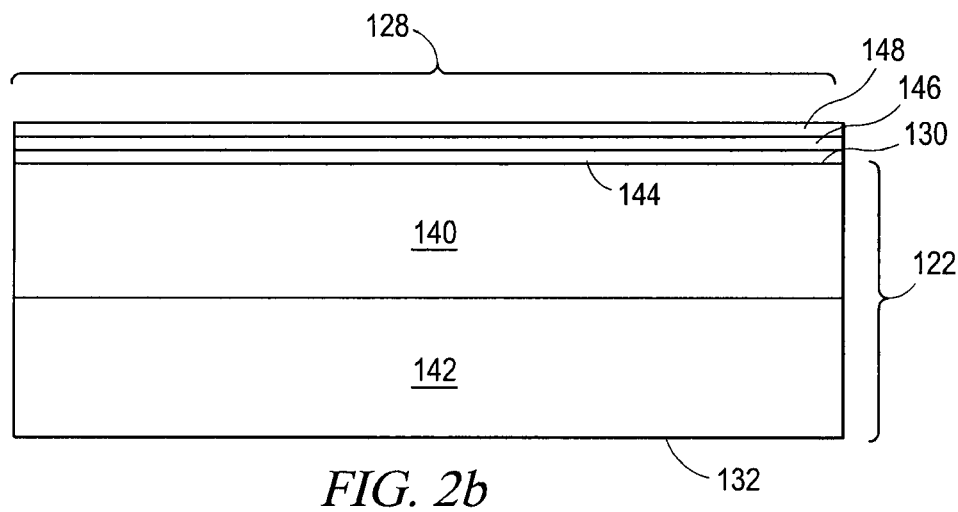
*FIG. 2a*
*FIG. 2b*

SEMICONDUCTOR DEVICE AND METHOD OF FORMING JUNCTION ENHANCED TRENCH POWER MOSFET

FIELD OF THE INVENTION

The present invention relates generally to electronic circuits and semiconductor devices and, more specifically, to a semiconductor device and method of forming a junction enhanced trench power MOSFET.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment. In particular, power MOSFETs are commonly used in electronic circuits, such as communication systems and power supplies, as electric switches to enable and disable the conduction of relatively large currents in DC to DC converter applications.

The power MOSFET includes a large number of MOSFET cells or individual transistors that are connected in parallel and distributed across a surface of a semiconductor die. To maximize power conversion efficiency, the power MOSFETs must exhibit low conduction and switching losses. Conduction losses are proportional to the drain to source resistance in the operational state (RDSON) of the transistor. Switching losses are proportional to the switching frequency and internal parasitic capacitance, most significantly gate to drain capacitance (Cgd). The trench power MOSFET is widely used due to its characteristic low RDSON. However, trench power MOSFETS commonly exhibit high Cgd. The trench MOSFET structure can be modified to improve Cgd, but at the expense of significantly increased manufacturing complexity.

A lateral MOSFET has a very small gate drain overlap resulting in a significantly lower Cgd than the trench MOSFET. The low Cgd makes the lateral MOSFET well suited for high frequency switching applications. A weakness of the lateral MOSFET structure is a higher RDSON compared to the trench MOSFET. The cell pitch of the lateral MOSFET includes an extended drift region to support the required blocking voltage of the device. The extended drift region requires a larger cell pitch and therefore higher RDSON. There remains a need for power MOSFET structure with improved device performance, i.e. low Cgd and low RDSON, and efficient manufacturability.

SUMMARY OF THE INVENTION

In one embodiment, the present invention is a method of making a semiconductor device comprising the steps of providing a substrate, forming first and second gate structures over a first surface of the substrate, forming a lateral LDD region between the first and second gate structures, forming a sidewall spacer over the first and second gate structures, forming a trench through the lateral LDD region and partially through the substrate, forming a vertical drift region along a sidewall of the trench, depositing an insulating material in the trench, forming a first source region adjacent to the first gate structure opposite the lateral LDD region, and forming a second source region adjacent to the second gate structure opposite the lateral LDD region.

In another embodiment, the present invention is a method of making a semiconductor device comprising the steps of providing a substrate, forming a gate structure over a first surface of the substrate, forming a lateral drift region adjacent to the gate structure, forming a trench through the lateral drift region and partially through the substrate, forming a vertical drift region along a sidewall of the trench, depositing an insulating material in the trench, and forming a source region adjacent to the gate structure opposite the lateral drift region.

In another embodiment, the present invention is a method of making a semiconductor device comprising the steps of providing a substrate, forming a gate structure over a first surface of the substrate, forming a lateral drift region adjacent to the gate structure, forming a vertical drift region partially through the substrate and contacting the lateral drift region, and forming a source region adjacent to the gate structure opposite the lateral drift region.

In another embodiment, the present invention is a semiconductor device comprising a substrate and gate structure formed over a first surface of the substrate. A lateral drift region is formed adjacent to the gate structure. A vertical drift region is formed partially through the substrate and contacting the lateral drift region. A source region is formed adjacent to the gate structure opposite the lateral drift region.

BRIEF DESCRIPTION OF THE DRAWINGS

FIG. 1 illustrates a semiconductor wafer containing a plurality of semiconductor die separated by a saw street;

DETAILED DESCRIPTION OF THE DRAWINGS

Figure 2C:
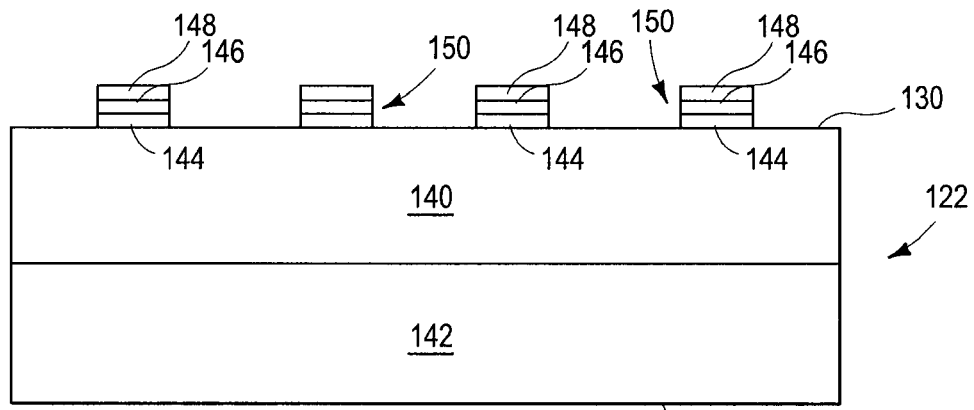
FIGS. 2a-2n illustrate a MOSFET cell with a lateral LDD region and vertical drift region.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

FIG. 1 shows a semiconductor wafer 120 containing a base material, such as silicon, germanium, gallium arsenide, indium phosphide, or silicon carbide, in substrate 122 for structural support. A plurality of semiconductor die or components 124 is formed on wafer 120 separated by a non-active, inter-die wafer area or saw street 126. Saw street 126 provides cutting areas to singulate semiconductor wafer 120 into individual semiconductor die 124.

Figure 2D:
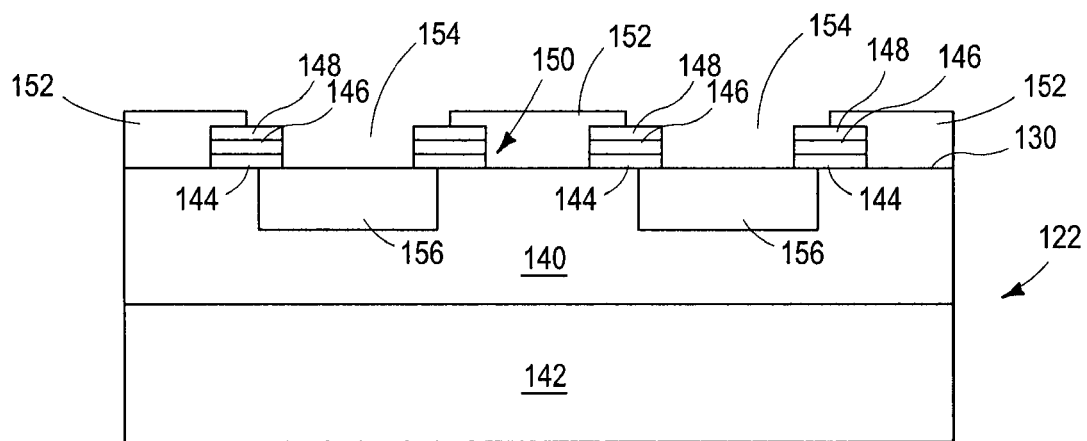
Figure 2E:
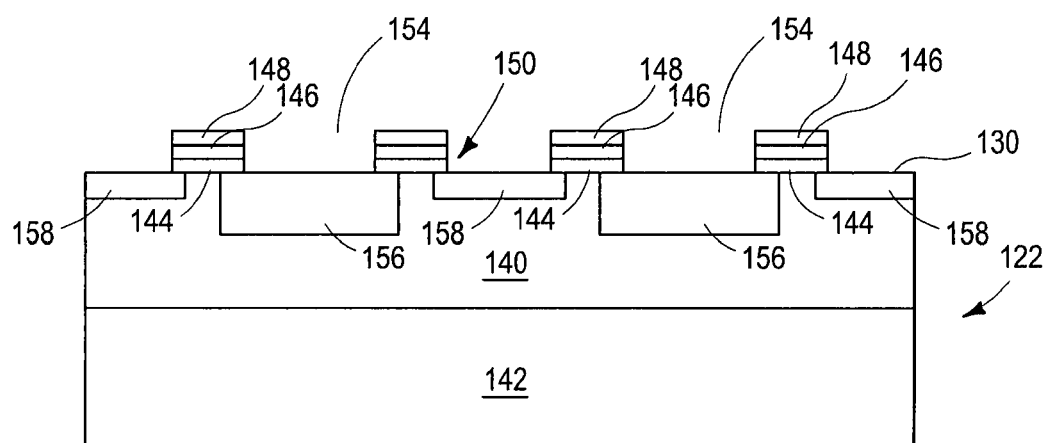
Figure 2F:
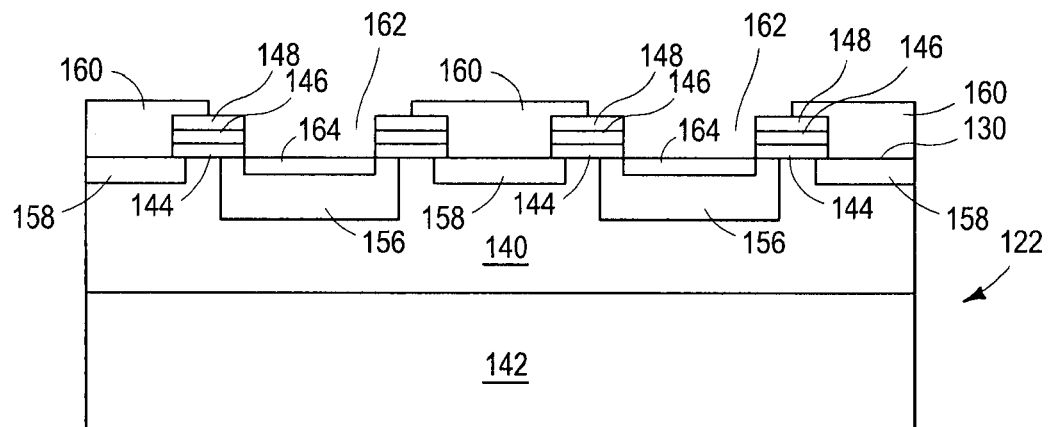
Figure 2G:
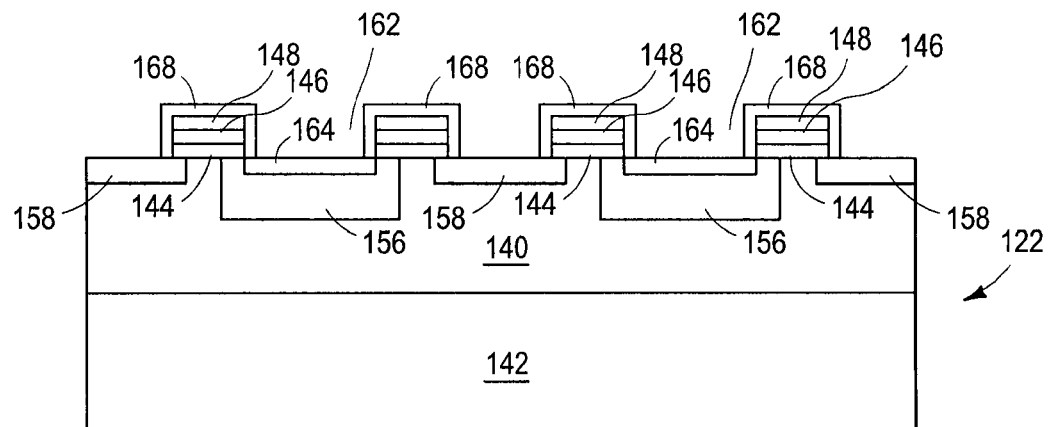
Figure 2H:
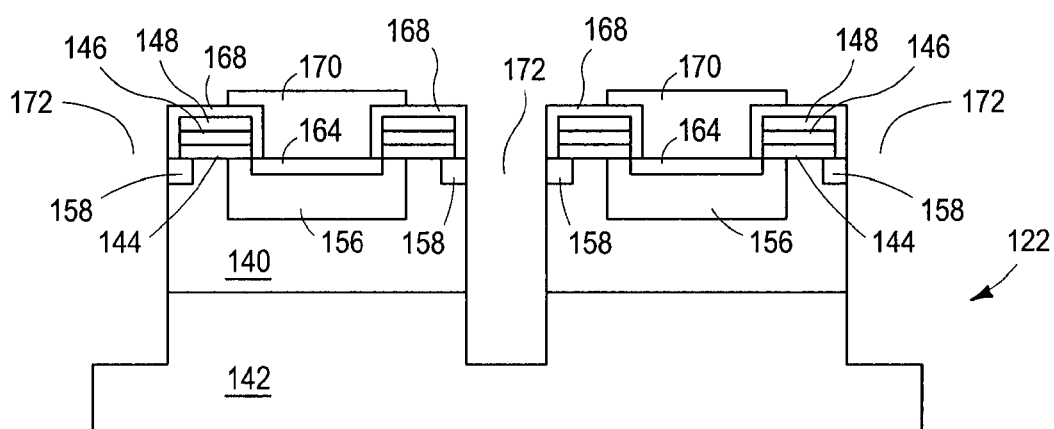
Figure 2I:
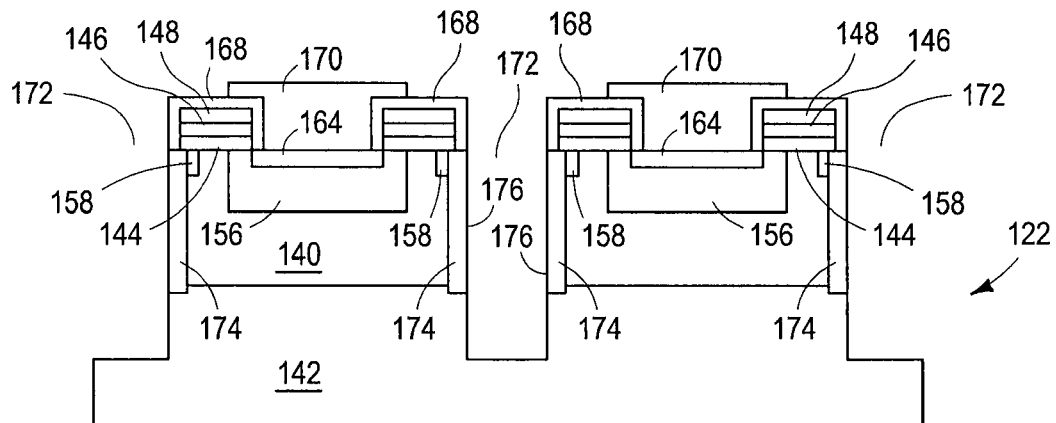
Figure 2J:
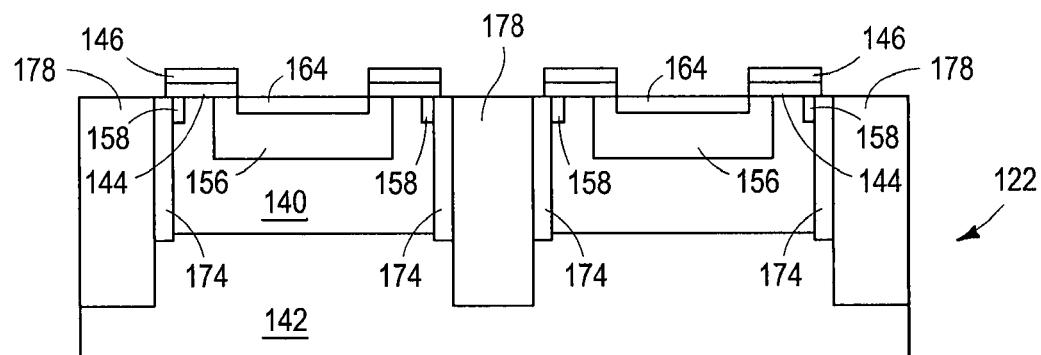
Figure 2K:
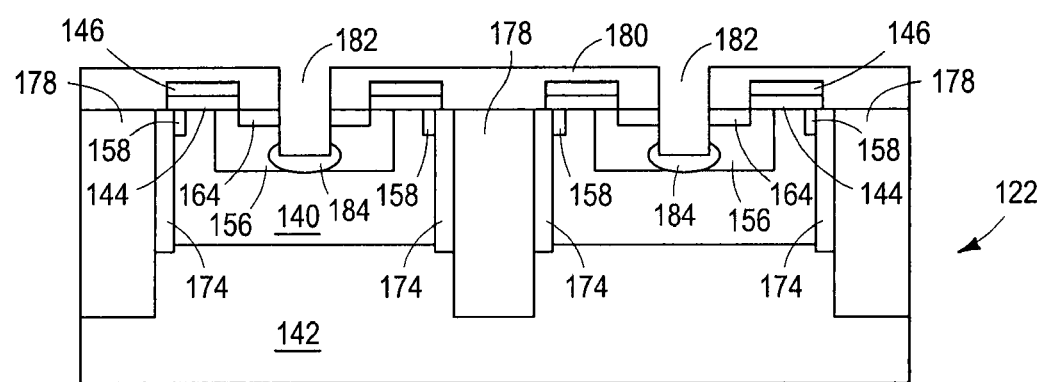
Figure 2L:
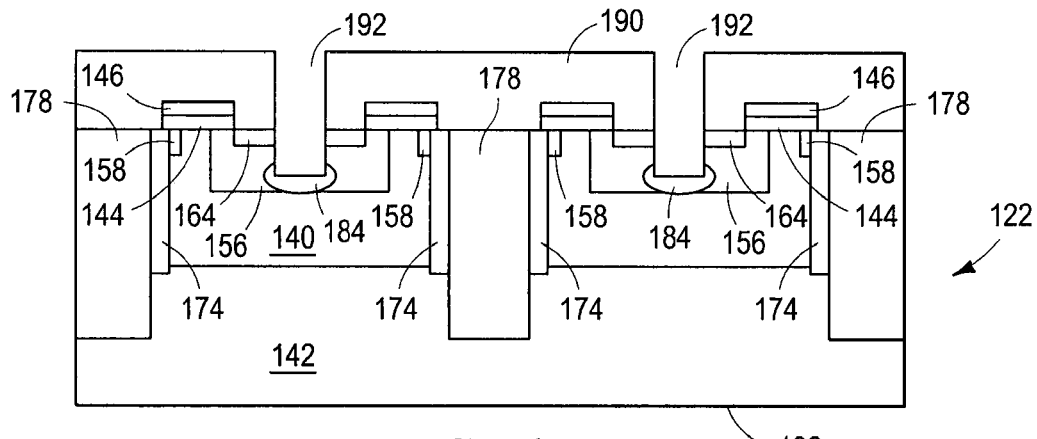
Figure 2M:
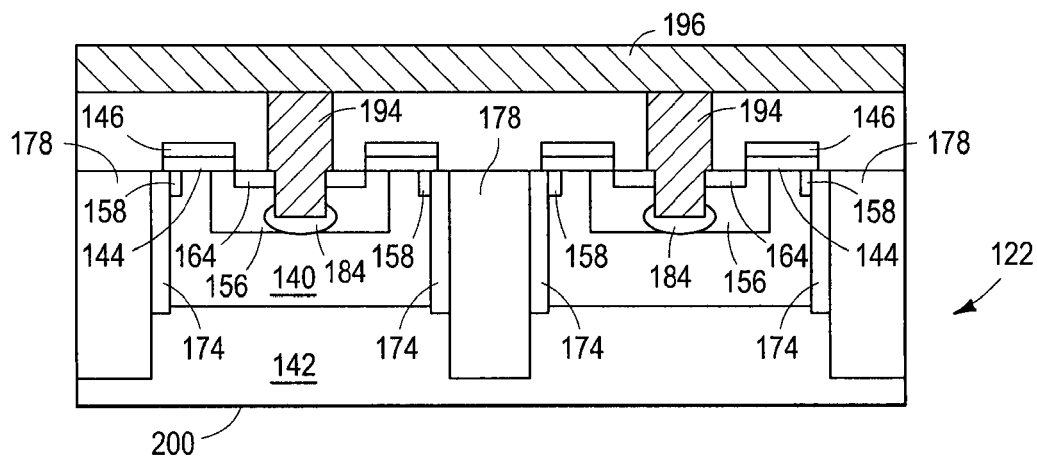
Figure 2N:
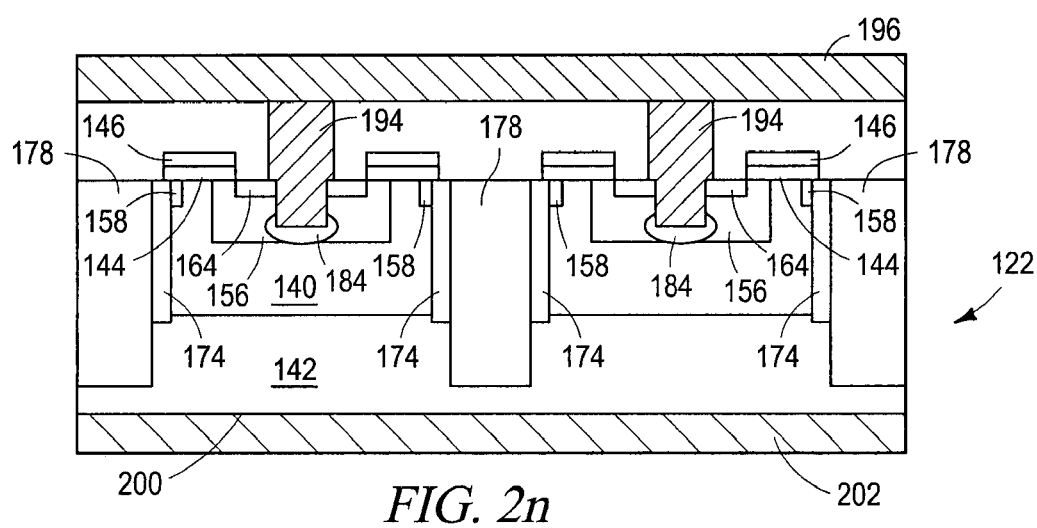

FIGS. 2a-2n illustrate a process of forming a junction enhanced trench MOSFET cell within a power MOSFET for a high current carrying application. In one embodiment, semiconductor die 124 contains a plurality of MOSFET cells 128 electrically connected in parallel to form a power MOSFET for high current carrying capacity in the range of 1-100 amperes (A) with a voltage rating of 10-300 volts (V). FIG. 2a shows a cross-sectional view of a portion of semiconductor wafer 120 for the formation of a plurality of MOSFET cells 128, as part of the power MOSFET, within substrate 122 for semiconductor die 124. The power MOSFET can be an n-channel device or a p-channel device, where "p" denotes a positive carrier type (hole) and "n" denotes a negative carrier type (electron). Although the present embodiment is described in terms of an N-MOS device, the opposite type semiconductor material can be used to form a P-MOS device.

Substrate 122 includes an active surface 130 and back surface 132 that is opposite the active surface. For N-MOS devices, substrate 122 includes p-epitaxial region 140 and N+ drain region 142. Alternatively, an n-epitaxial layer can used to form region 140. Substrate 122 is initially made with n-type semiconductor material, such as phosphorus, antimony, or arsenic. The p-epitaxial region 140 is grown onto the N+ substrate. In one embodiment, p-epitaxial region 140 has a thickness of 1-10 micrometers (μm), and N+ drain region 142 has a thickness of 100-700 μm.

In FIG. 2b, an insulating layer 144 is formed over active surface 130. The insulating layer 144 contains one or more layers of silicon dioxide (SiO2), tantalum pentoxide (Ta2O5), aluminum oxide (Al2O3), or other suitable oxide material. A polysilicon layer 146 is formed over insulating layer 144. An insulating or dielectric layer 148 is formed over polysilicon layer 146. The insulating layer 148 contains one or more layers of silicon nitride (Si3N4), silicon oxynitride (SiON), polyimide, benzocyclobutene (BCB), polybenzoxazoles (PBO), or other suitable dielectric material. Layers 144-148 are formed using physical vapor deposition (PVD), chemical vapor deposition (CVD), screen printing, spin coating, spray coating, or other suitable deposition process. In one embodiment, insulating layer 144 is an oxide layer, and insulating layer 148 is a nitride layer.

In FIG. 2c, polysilicon layer 146 and insulating layers 144 and 148 are patterned and etched to form gate oxide structures 150 with a thickness of 100-1000 angstroms (Å), width of 0.2-1.0 μm, and spacing of 0.5-3.0 μm between gate oxide structures. The insulating layer 148 remains over the patterned polysilicon layer 146 following the etching process.

In FIG. 2d, a photoresist layer 152 is formed over active surface 130 and gate oxide structures 150. A portion of photoresist layer 152 is removed by a photolithography process to form openings 154 and expose active surface 130 between gate oxide structures 150. A p-type dopant, such as boron, aluminum, or gallium, is deposited by ion implantation with dosage of 5E+13 atoms/cm$^2$ at 40 keV to form p-channel regions 156. Other implants can be deposited at appropriate dosages and energy levels. The p-channel region 156 occupies the area between adjacent gate oxide structures 150 and is diffused from one side partially under the gate oxide structures.

In FIG. 2e, photoresist layer 152 is removed and substrate 122 is doped with n-type semiconductor material, such as phosphorus, antimony, or arsenic, within p-epitaxial region 140 to form lateral lightly doped drift (LDD) regions 158, self-aligned to insulating layer 148 and polysilicon layer 146. In one embodiment, the n-type dopant is deposited by ion implantation with dosage of 1E+12 atoms/cm$^2$ at 50 keV. Other implants can be deposited at appropriate dosages and energy levels. No mask is needed for the ion implantation, although a mask could be used to block the n-type dopant from entering the p-channel region 156. The lateral LDD region 158 is formed in active surface 130 adjacent to gate oxide structure 150, i.e. extending up to or partially under the gate oxide structure. The lateral LDD regions 158 extend to a depth of 100-800 nm below active surface 130. The lateral LDD region 158 can be formed using a chain of high energy implants. The self-alignment of lateral LDD regions 158 to insulating layer 148 and polysilicon layer 146, as well as precise control over the doping levels of the lateral LDD regions, reduces Cgd for faster switching. The lateral LDD regions 158 can be tuned by controlling the doping levels to reduce punch through effects and control hot carrier injection (HCI) and breakdown voltage ($BV_{DSS}$).

In FIG. 2f, a photoresist layer 160 is formed over active surface 130 and gate oxide structures 150. A portion of photoresist layer 160 is removed by a photolithography process to form openings 162 and expose p-channel region 156 between gate oxide structures 150. Substrate 122 is heavily doped with n-type semiconductor material, such as phosphorus, antimony, or arsenic, within p-epitaxial region 140 to form N+ source region 164, self-aligned to insulating layer 148 and polysilicon layer 146. N+ source region 164 is formed in active surface 130 adjacent to gate oxide structure 150, i.e. extending up to or partially under the gate oxide structure. In one embodiment, the n-type dopant is deposited by ion implantation with dosage of 3E+15 atoms/cm$^2$ at 50 KeV. Other implants can be deposited at appropriate dosages and energy levels. N+ source regions 164 extend to a depth of 100-500 nm below active surface 130.

In FIG. 2g, photoresist layer 160 is removed. An insulating layer 168 is formed over and around insulating layer 144, polysilicon layer 146, and insulating layer 148 using PVD, CVD, screen printing, spin coating, spray coating, or other suitable deposition process. The insulating layer 168 contains one or more layers of SiO2, Si3N4, SiON, Ta2O5, Al2O3, polyimide, BCB, PBO, or other suitable dielectric material. The insulating layer 168 completely covers gate oxide structure 150 to protect the layers from subsequent etching processes. The insulating layer 168 also operates as a sidewall spacer after being partially etched to mask subsequent ion implants and etching processes.

In FIG. 2h, a photoresist layer 170 is formed over N+ source regions 164 and insulating layer 168. A portion of photoresist layer 170 is removed by a photolithography process to expose lateral LDD region 158 between sidewall spacers 168. A trench 172 is formed by an etching process through lateral LDD region 158 and epitaxial region 140 and extending partially into N+ region 142. Alternatively, trench 172 is formed by laser direct ablation (LDA). In one embodiment, trench 172 has a width of 0.2-1.0 μm and depth of 1.0-10 μm. Trench 172 is self-aligned to the sidewall spacers formed by insulating layer 168. Using insulating layer 168 as an etching barrier to self-align trench 172 to the sidewall spacers reduces the overall area of MOSFET cell 128, maintains consistency between MOSFET cells 128 across semiconductor die 124, and reduces Cgd.

In FIG. 2i, a vertical drift region 174 is formed in sidewall 176 of trench 172 using an angled ion implantation of n-type dopant, such as phosphorus, antimony, or arsenic, with dosage of 7E+12 atoms/cm$^2$ at 50 keV. Other implants can be deposited at appropriate dosages and energy levels. Alternatively, region 174 can be formed using PVD or other doping techniques.

In FIG. 2j, trench 172 is filled with an insulating material 178. In one embodiment, insulating material 178 includes tetraethyl-orthosilicate (TEOS) deposited using a high-temperature low-pressure deposition process, such as vapor deposition. Alternatively, insulating material 178 can be one or more layers of SiO2, Si3N4, SiON, Ta2O5, Al2O3, polyimide, BCB, PBO, or other suitable dielectric material. The insulating material 178 has a low dielectric constant to reduce parasitic capacitance across the TEOS-filled trench 172. The insulating layers 148 and 168 and photoresist layer 170 are removed by an etching process.

In FIG. 2k, a photoresist layer 180 is formed over active surface 130 and gate oxide structures 150. A portion of photoresist layer 180 is removed by a patterned etching process to form openings 182 extending down through N+ source region 164 and partially into p-channel region 156. Alternatively, openings 182 are formed by LDA. A p-type dopant, such as boron, aluminum, or gallium, is deposited by ion implantation with dosage of 1E+15 atoms/cm$^2$ at 30 keV into opening 182 to form P+ region 184 as an ohmic contact to p-epitaxial region 140. Other implants can be deposited at appropriate dosages and energy levels.

In FIG. 2l, photoresist layer 180 is removed. An insulating layer 190 is formed over active surface 130 and gate oxide structures 150 using PVD, CVD, screen printing, spin coating, spray coating, or other suitable deposition process. In one embodiment, insulating layer 190 includes TEOS deposited using a high-temperature low-pressure deposition process, such as vapor deposition. Alternatively, insulating layer 190 can be one or more layers of SiO2, Si3N4, SiON, Ta2O5, Al2O3, polyimide, BCB, PBO, or other suitable dielectric material. A portion of insulating layer 190 is removed by a patterned etching process to form openings 192 extending down to and exposing P+ region 184. Alternatively, openings 192 are formed by LDA.

In FIG. 2m, an electrically conductive material 194 is deposited into openings 192 using PVD, CVD, electrolytic plating, electroless plating process, sputtering, or other suitable metal deposition process. Conductive material 194 can be one or more layers of Al, Cu, Sn, Ni, Au, Ag, tungsten (W), or other suitable electrically conductive material. Conductive material 194 operates as a source contact electrically connected to N+ source region 164 and p-epitaxial region 140.

An electrically conductive layer 196 is formed over insulating layer 190 and conductive material 194 using PVD, CVD, electrolytic plating, electroless plating process, sputtering, or other suitable metal deposition process. Conductive layer 196 can be one or more layers of Al, Cu, Sn, Ni, Au, Ag, W, or other suitable electrically conductive material. Conductive layer 196 is a source metal 1 interconnect layer electrically connected to conductive material 194.

A portion of back surface 132 of substrate 122 is optionally removed by backgrinding or chemical mechanical polishing (CMP) to planarize surface 200 and reduce the thickness of substrate 122. In one embodiment, substrate 122 has a thickness of 200 μm after backgrinding.

In FIG. 2n, an electrically conductive layer 202 is formed over planarized surface 200 of substrate 122 using PVD, CVD, electrolytic plating, electroless plating process, sputtering, or other suitable metal deposition process. Conductive layer 202 can be one or more layers of Al, Cu, Sn, Ni, Au, Ag, W, or other suitable electrically conductive material. Conductive layer 202 operates as a drain contact electrically connected to N+ drain region 142.

In operation of the MOSFET cell 128, a voltage is applied to gate oxide structure 150 to create an electric field across p-channel region 156 and p-epitaxial region 140 under the gate oxide structure. The surface of p-channel region 156 and p-epitaxial region 140 inverts forming an n-type surface conductive channel between N+ source region 164 and lateral LDD region 158. A current flows through source contact 194 and N+ source region 164 and laterally across the n-channel to lateral LDD region 158. The current continues vertically down vertical drift region 174 and N+ drain region 142 to drain contact 202. A large number of MOSFET cells 128 are connected in parallel across substrate 122 to conduct a total current through the junction enhanced trench MOSFET in the range of 1-100 A with a voltage rating of 10-300 V. The current through the power MOSFET has a lateral component from source contact 194 through N+ source region 164, n-channel, and lateral LDD region 158. The current through the power MOSFET has a vertical component through vertical drift region 174 and N+ drain region 142 to drain contact 202. The vertical component of the current through vertical drift region 174 and N+ drain region 142 substantially reduces the cell pitch and thus the specific RDSON of the power MOSFET. The lateral LDD region 158 and vertical drift region 174 constitute a 90° turn or realignment of the drift region, i.e., from lateral to vertical. The sidewall spacers formed by insulating layer 168 self-align trench 172, which reduces the overall area of MOSFET cell 128, maintains consistency between MOSFET cells 128 across semiconductor die 124, and reduces Cgd. The power MOSFET with lateral LDD region 158 and vertical drift region 174 achieves a lower pitch between MOSFET cells, e.g., 3.0 μm, and smaller size for semiconductor die 124. In one embodiment, vertical drift region 174 and p-epitaxial region 140 form charge balanced n- and p-type columns, forming a superjunction and further reducing RDSON. The name of junction enhanced trench MOSFET originates from the superjunction operation mode of the device.

Figure 3A:
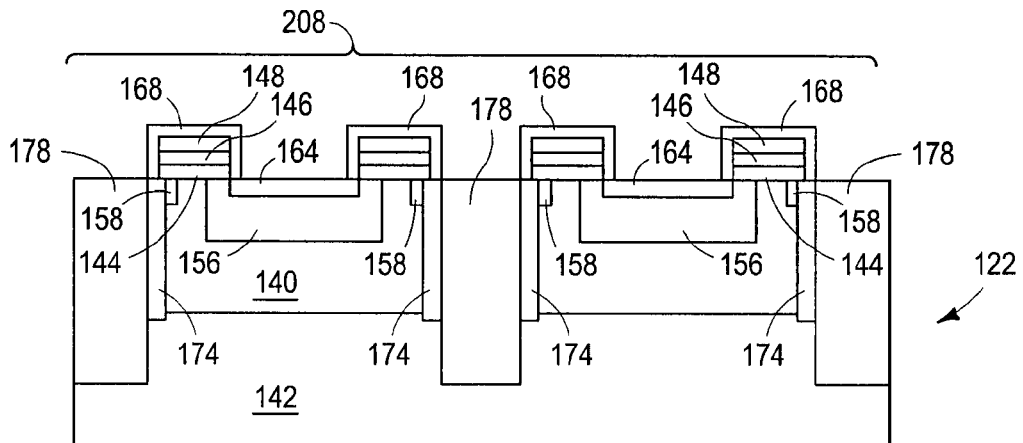
FIGS. 3a-3f illustrate another embodiment of the MOSFET cell with a lateral LDD region and vertical drift region.

FIGS. 3a-3f illustrates an alternate embodiment of MOSFET cell 208. Continuing from FIG. 2i, trench 172 is filled with an insulating material 178, as shown in FIG. 3a. In one embodiment, insulating material 178 includes TEOS deposited using a high-temperature low-pressure deposition process, such as vapor deposition. Alternatively, insulating material 178 can be one or more layers of SiO2, Si3N4, SiON, Ta2O5, Al2O3, polyimide, BCB, PBO, or other suitable dielectric material. The insulating material 178 has a low dielectric constant to reduce parasitic capacitance across the TEOS-filled trench 172. Photoresist layer 170 is removed by an etching process, while insulating layers 148 and 168 remain in place over polysilicon layer 146 and insulating layer 144.

Figure 3B:
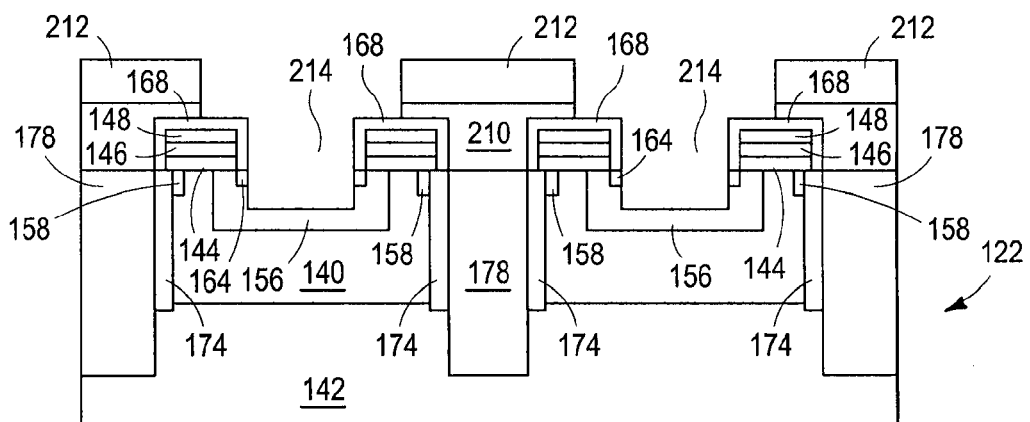

In FIG. 3b, an insulating layer 210 is formed over active surface 130 and gate oxide structures 150 using PVD, CVD, screen printing, spin coating, spray coating, or other suitable deposition process. In one embodiment, insulating layer 210 includes TEOS deposited using a high-temperature low-pressure deposition process, such as vapor deposition. Alternatively, insulating layer 210 can be one or more layers of SiO2, Si3N4, SiON, Ta2O5, Al2O3, polyimide, BCB, PBO, or other suitable dielectric material. A photoresist layer 212 is formed over insulating layer 210. A portion of photoresist layer 212 and insulating layer 210 is removed by a photolithography process to form openings 214 extending down through N+ source region 164 and partially into p-channel region 156. Alternatively, openings 214 is formed by LDA.

Figure 3C:
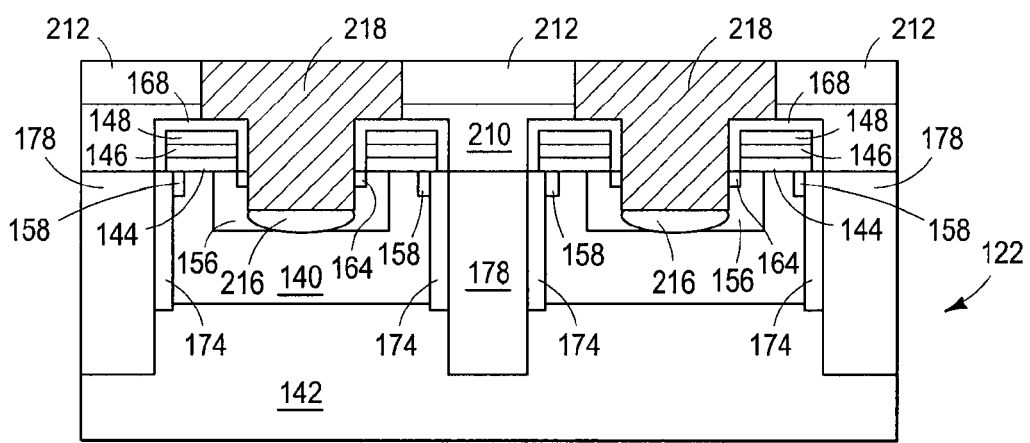

In FIG. 3c, a p-type dopant, such as boron, aluminum, or gallium, is deposited by ion implantation with dosage of 1E+15 atoms/cm$^2$ at 30 keV into opening 214 to form P+ region 216 as an ohmic contact to p-epitaxial region 140. Other implants can be deposited at appropriate dosages and energy levels. An electrically conductive material 218 is deposited into openings 214 using PVD, CVD, electrolytic plating, electroless plating process, sputtering, or other suitable metal deposition process. Conductive material 218 can be one or more layers of Al, Cu, Sn, Ni, Au, Ag, W, or other suitable electrically conductive material. Conductive layer 218 operates as a source contact electrically connected to N+ source region 164 and p-epitaxial region 140.

Figure 3D:
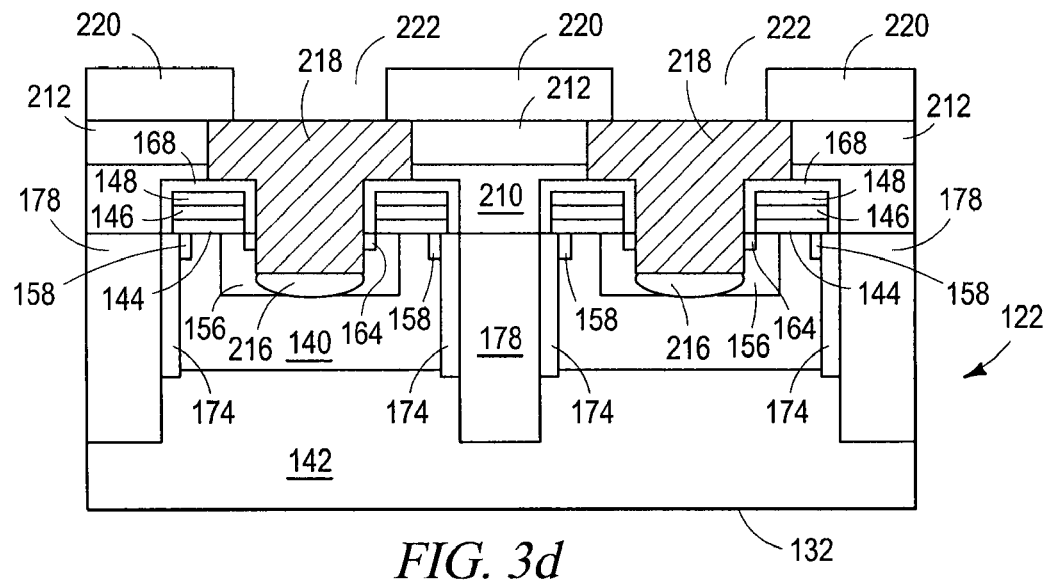

In FIG. 3d, photoresist layer 212 is removed. An insulating layer 220 is formed over insulating layer 210 and conductive material 218 using PVD, CVD, screen printing, spin coating, spray coating, or other suitable deposition process. In one embodiment, insulating layer 220 includes TEOS deposited using a high-temperature low-pressure deposition process, such as vapor deposition. Alternatively, insulating layer 220 can be one or more layers of SiO2, Si3N4, SiON, Ta2O5, Al2O3, polyimide, BCB, PBO, or other suitable dielectric material. A portion of insulating layer 220 is removed by a patterned etching process to form openings 222 and expose conductive layer 218. Alternatively, openings 222 are formed by LDA.

Figure 3E:
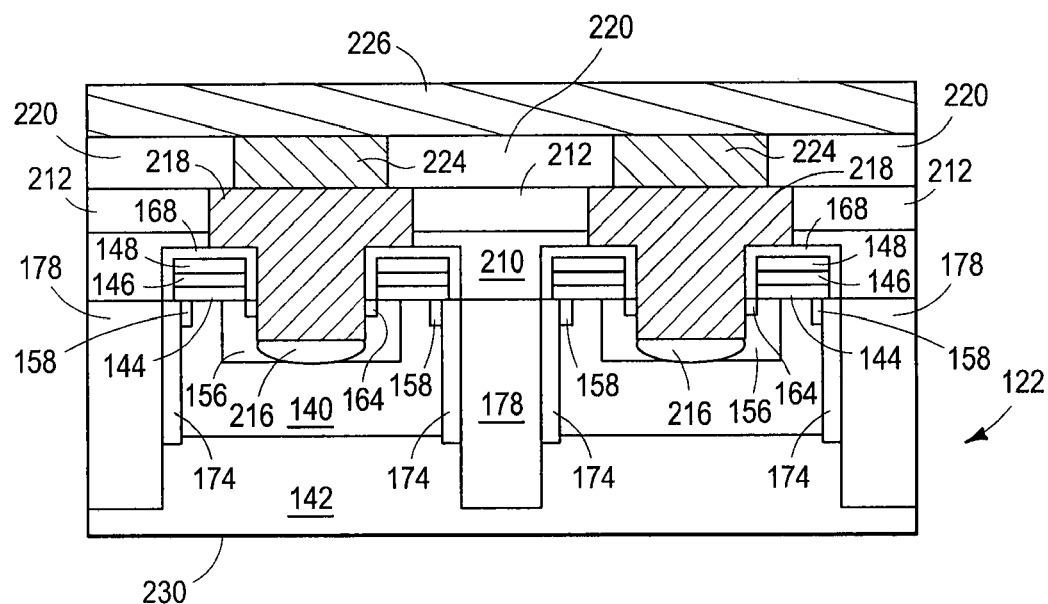

In FIG. 3e, an electrically conductive material 224 is deposited into openings 222 using PVD, CVD, electrolytic plating, electroless plating process, sputtering, or other suitable metal deposition process. Conductive material 224 can be one or more layers of Al, Cu, Sn, Ni, Au, Ag, W, or other suitable electrically conductive material. Conductive material 224 is electrically connected to conductive material 218.

An electrically conductive layer 226 is formed over insulating layer 220 and conductive material 224 using PVD, CVD, electrolytic plating, electroless plating process, sputtering, or other suitable metal deposition process. Conductive layer 226 can be one or more layers of Al, Cu, Sn, Ni, Au, Ag, W, or other suitable electrically conductive material. Conductive layer 226 is electrically connected to conductive material 224.

A portion of back surface 132 of substrate 122 is optionally removed by backgrinding or CMP to planarize surface 230 and reduce the thickness of substrate 122. In one embodiment, substrate 122 has a thickness of 200 µm after backgrinding.

Figure 3F:
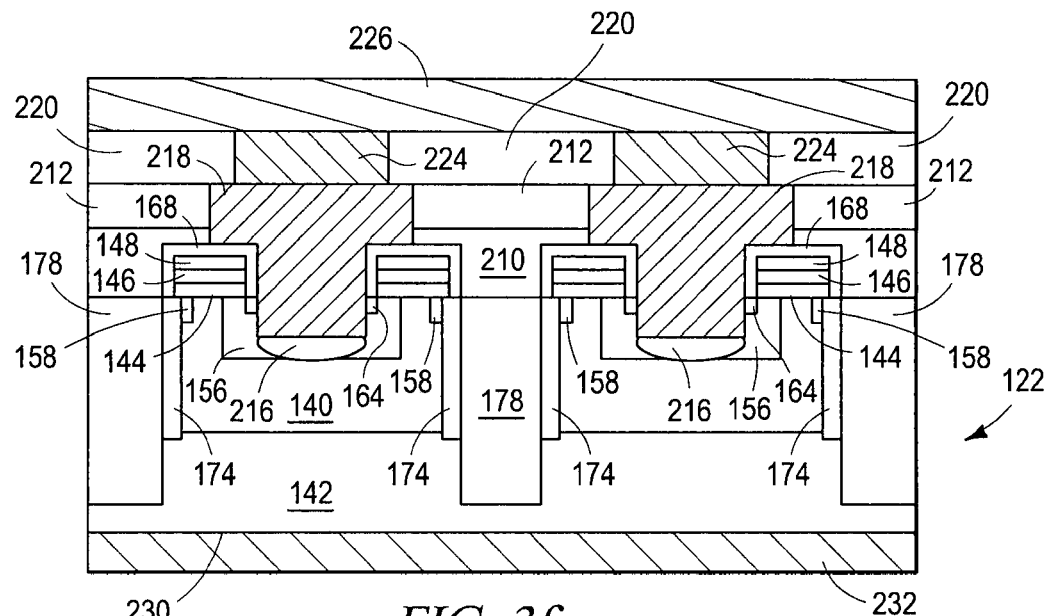

In FIG. 3f, an electrically conductive layer 232 is formed over planarized surface 230 of substrate 122 using PVD, CVD, electrolytic plating, electroless plating process, sputtering, or other suitable metal deposition process. Conductive layer 232 can be one or more layers of Al, Cu, Sn, Ni, Au, Ag, W, or other suitable electrically conductive material. Conductive layer 232 operates as a drain contact electrically connected to N+ drain region 142.

In operation of the MOSFET cell 208, a voltage is applied to gate oxide structure 150 to create an electric field across p-channel region 156 and p-epitaxial region 140 under the gate oxide structure. The surface of p-channel region 156 and p-epitaxial region 140 inverts forming an n-type surface conductive channel between N+ source region 164 and lateral LDD region 158. A current flows through source contact 218 and N+ source region 164 and laterally across the n-channel to lateral LDD region 158. The current continues vertically down vertical drift region 174 and N+ drain region 142 to drain contact 232. A large number of MOSFET cells 208 are connected in parallel across substrate 122 to conduct a total current through the junction enhanced trench MOSFET in the range of 1-100 A with a voltage rating of 10-300 V.

The current through the power MOSFET has a lateral component from source contact 218 through N+ source region 164, p-channel, and lateral LDD region 158. The current through the power MOSFET has a vertical component through vertical drift region 174 and N+ drain region 142 to drain contact 232. The vertical component of the current through vertical drift region 174 and N+ drain region 142 substantially reduces RDSON of the power MOSFET. The lateral LDD region 158 and vertical drift region 174 constitute a 90° turn or realignment of the drift region, i.e., from lateral to vertical. The sidewall spacers formed by insulating layer 168 self-align trench 172, which reduces the overall area of MOSFET cell 208, maintains consistency between MOSFET cells 208 across semiconductor die 124, and reduces Cgd. The power MOSFET with lateral LDD region 158 and vertical drift region 174 achieves a lower pitch between MOSFET cells and smaller size for semiconductor die 124.

Figure 4:
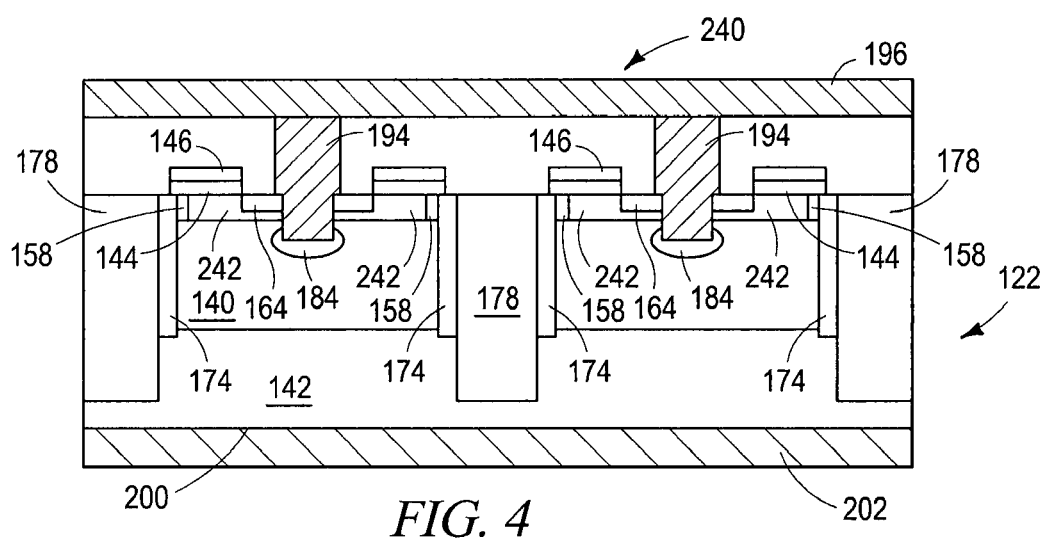
FIG. 4 illustrates a MOSFET cell with a p-well region for the p-channel between the source region and lateral LDD region.

FIG. 4 shows an alternate embodiment of MOSFET cell 240, similar to FIG. 2n, with p-well region 242 formed in p-epitaxial region 140. Continuing from FIG. 2a, p-well region 242 is formed by depositing a p-type dopant, such as boron, aluminum, or gallium, using ion implantation with dosage of 5E+13 atoms/cm$^2$ at 40 keV into p-epitaxial region 140. Other implants can be deposited at appropriate dosages and energy levels. After forming p-well region 242 into p-epitaxial region 140, an insulating layer 144, polysilicon layer 146, and insulating layer 148 are formed as described in FIGS. 2b-2c. The remaining structure of MOSFET cell 240 generally follows the process described in FIGS. 2e-2n.

In operation of the MOSFET cell 240, a voltage is applied to gate oxide structure 150 to create an electric field across p-well region 242 under the gate oxide structure. The surface of p-well region 242 inverts forming an n-type surface conductive channel between N+ source region 164 and lateral LDD region 158. A current flows through source contact 194 and N+ source region 164 and laterally across the n-channel to lateral LDD region 158. The current continues vertically down vertical drift region 174 and N+ drain region 142 to drain contact 202. A large number of MOSFET cells 240 are connected in parallel across substrate 122 to conduct a total current through the junction enhanced trench MOSFET in the range of 1-100 A with a voltage rating of 10-300 V.

Figure 5:
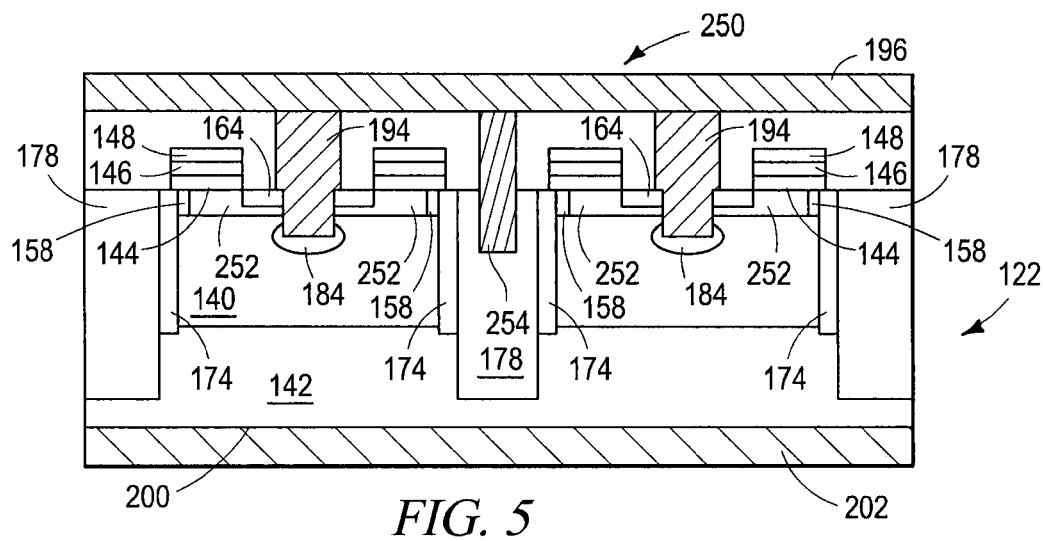
FIG. 5 illustrates a MOSFET cell with a conductive plug formed in the vertical insulating layer adjacent to the lateral LDD region and vertical drift region.

FIG. 5 shows an alternate embodiment of MOSFET cell 250, similar to FIG. 4, with p-well region 252 formed in p-epitaxial region 140. MOSFET cell 250 further includes conductive plug 254. An opening is formed through insulating layer 190 and partially through insulating layer 178, prior to forming conductive layer 196, see FIG. 2l. The opening in insulating layers 190 and insulating layer 178 is filled with conductive material, such as Al, Cu, Sn, Ni, Au, Ag, W, or doped polysilicon, to form plug 254. Plug 254 depletes lateral LDD regions 158 and opposing portion of region 174 which allows the lateral LDD regions to be heavily doped with n-type semiconductor material for a lower RDSON while reducing the gate to drain charge. Plug 254 can also be used with MOSFET cell 128 in FIG. 2m.

In operation of the MOSFET cell 250, a voltage is applied to gate oxide structure 150 to create an electric field across p-well region 252 under the gate oxide structure. The surface of p-well region 252 inverts forming an n-type surface conductive channel between N+ source region 164 and lateral LDD region 158. A current flows through source contact 194 and N+ source region 164 and laterally across the n-channel to lateral LDD region 158. The current continues vertically down vertical drift region 174 and N+ drain region 142 to drain contact 202. A large number of MOSFET cells 250 are connected in parallel across substrate 122 to conduct a total current through the junction enhanced trench MOSFET in the range of 1-100 A with a voltage rating of 10-300 V.

Figure 6:
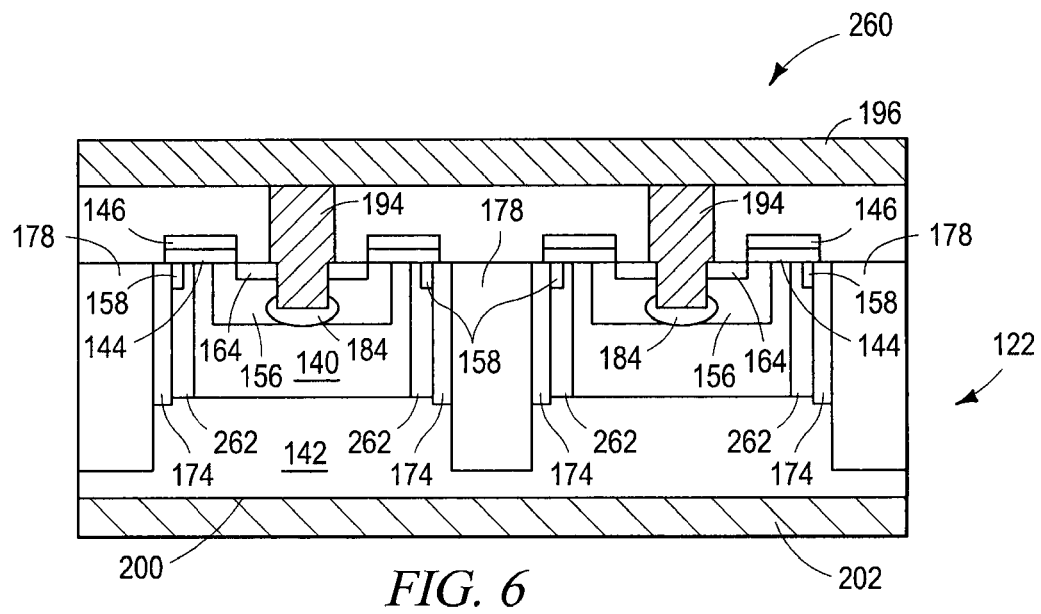
FIG. 6 illustrates a MOSFET cell with a vertical p-column region adjacent to the vertical drift region.

FIG. 6 shows an alternate embodiment of MOSFET cell 260, similar to FIG. 2n, with a vertical p-column region 262 formed in p-epitaxial region 140, adjacent to vertical drift region 174. Continuing from FIG. 2h, vertical p-column region 262 is formed in p-epitaxial region 140 using an angled ion implantation of p-type dopant, such as boron, aluminum, or gallium. The vertical p-column region 262 is formed prior to forming vertical drift region 174. After forming p-column region 262, vertical drift region 174 is formed in sidewall 176 of trench 172 using an angled ion implantation of n-type dopant, such as phosphorus, antimony, or arsenic, with dosage of 7E+12 atoms/cm$^2$ at 50 keV, similar to FIG. 2i. Other implants can be deposited at appropriate dosages and energy levels. The lateral drift region 174 is formed in p-epitaxial region 140 adjacent to p-column region 262. The vertical p-column region 262 and vertical drift region 174 form a superjunction for depleting vertical drift region 174, which allows the drift region to be heavily doped with n-type semiconductor material for a lower RDSON while reducing the gate to drain charge. The remaining structure of MOSFET cell 260 generally follows the process described in FIGS. 2j-2n.

In operation of the MOSFET cell 260, a voltage is applied to gate oxide structure 150 to create an electric field across p-channel region 156, p-epitaxial region 140, and vertical p-column region 262 under the gate oxide structure. The surface of p-channel region 156, p-epitaxial region 140, and p-column region 262 inverts forming an n-type surface conductive channel between N+ source region 164 and lateral LDD region 158. A current flows through source contact 194 and N+ source region 164 and laterally across the n-channel to lateral LDD region 158. The current continues vertically down vertical drift region 174 and N+ drain region 142 to drain contact 202. A large number of MOSFET cells 128 are connected in parallel across substrate 122 to conduct a total current through the junction enhanced trench MOSFET in the range of 1-100 A with a voltage rating of 10-300 V.

While one or more embodiments of the present invention have been illustrated in detail, the skilled artisan will appreciate that modifications and adaptations to those embodiments may be made without departing from the scope of the present invention as set forth in the following claims.

The invention claimed is:

1. A method of making a semiconductor device, comprising:
 providing a substrate;
 forming a gate structure over a first surface of the substrate;
 forming a lateral drift region adjacent to the gate structure;
 forming a sidewall spacer over the gate structure;
 forming a trench through the lateral drift region and partially through the substrate, the trench self-aligned to the sidewall spacer;
 forming a vertical drift region along a sidewall of the trench;
 depositing an insulating material in the trench; and
 forming a source region adjacent to the gate structure opposite the lateral drift region.

2. The method of claim 1, wherein providing the substrate includes:
 forming a drain region in the substrate as a second surface of the substrate opposite the first surface of the substrate; and
 forming an epitaxial region in the substrate over the drain region.

3. The method of claim 2, further including:
 forming an insulating layer over the first surface of the substrate and the gate structure;
 forming a first conductive layer over the insulating layer electrically connected to the source region; and
 forming a second conductive layer over the second surface of the substrate electrically connected to the drain region.

4. The method of claim 1, further including forming a channel region adjacent to the gate structure opposite the lateral drift region.

5. The method of claim 1, further including forming a vertical column region adjacent to the vertical drift region.

6. The method of claim 1, further including forming a conductive plug in the trench.

7. A method of making a semiconductor device, comprising:
 providing a substrate;
 forming a gate structure over a first surface of the substrate;
 forming a lateral drift region adjacent to the gate structure;
 forming a sidewall spacer over the gate structure for self-aligning the insulating trench;
 forming an insulating trench through the lateral drift region and partially through the substrate;
 forming a vertical drift region partially through the substrate and contacting the lateral drift region; and
 forming a source region adjacent to the gate structure opposite the lateral drift region.

8. The method of claim 7, further including forming the vertical drift region along a sidewall of the trench.

9. The method of claim 8, wherein forming the vertical drift region includes forming a plurality of doped regions between the lateral drift region and source region.

10. The method of claim 7, wherein providing the substrate includes:
 forming a drain region in the substrate as a second surface of the substrate opposite the first surface of the substrate; and
 forming an epitaxial region in the substrate over the drain region.

11. The method of claim 10, further including:
 forming an insulating layer over the first surface of the substrate and the gate structure;
 forming a first conductive layer over the insulating layer electrically connected to the source region; and
 forming a second conductive layer over the second surface of the substrate electrically connected to the drain region.

12. A semiconductor device, comprising:
 a substrate;
 a gate structure formed over a first surface of the substrate;
 a lateral drift region formed adjacent to the gate structure;
 a sidewall spacer formed over the gate structure for self-aligning the insulating trench;
 an insulating trench formed through the lateral drift region and partially through the substrate;
 a vertical drift region formed partially through the substrate and contacting the lateral drift region; and
 a source region formed adjacent to the gate structure opposite the lateral drift region.

13. The semiconductor device of claim 12, further including a conductive plug formed in the insulating trench.

14. The semiconductor device of claim 12, wherein the substrate includes:
- a drain region formed in the substrate as a second surface of the substrate opposite the first surface of the substrate; and
- an epitaxial region formed in the substrate over the drain region.

15. The semiconductor device of claim 12, further including a vertical column region formed adjacent to the vertical drift region.

16. A semiconductor device, comprising:
- a substrate;
- a gate structure formed over a first surface of the substrate;
- a lateral drift region formed adjacent to the gate structure;
- a sidewall spacer formed over the gate structure;
- a trench formed through the lateral drift region and partially through the substrate, the trench self-aligned to the sidewall spacer;
- a vertical drift region formed along a sidewall of the trench;
- an insulating material deposited in the trench; and
- a source region formed adjacent to the gate structure opposite the lateral drift region.

17. The semiconductor device of claim 16, further including a vertical column region formed adjacent to the vertical drift region.

18. The semiconductor device of claim 16, further including a conductive plug formed in the trench.

19. The semiconductor device of claim 16, wherein the substrate includes:
- a drain region formed in the substrate as a second surface of the substrate opposite the first surface of the substrate; and
- an epitaxial region formed in the substrate over the drain region.

20. The semiconductor device of claim 19, further including:
- an insulating layer formed over the first surface of the substrate and the gate structure;
- a first conductive layer formed over the insulating layer electrically connected to the source region; and
- a second conductive layer formed over the second surface of the substrate electrically connected to the drain region.

21. The semiconductor device of claim 16, further including a channel region formed adjacent to the gate structure opposite the lateral drift region.

* * * * *